US012773926B2

(12) United States Patent
Park

(10) Patent No.: US 12,773,926 B2
(45) Date of Patent: Oct. 27, 2026

(54) ELECTRIFIED VEHICLE AND METHOD OF INSPECTION FOR SAME

(71) Applicants: Hyundai Motor Company, Seoul (KR); Kia Corporation, Seoul (KR)

(72) Inventor: Min Gyu Park, Whasung-Si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 938 days.

(21) Appl. No.: 18/099,204

(22) Filed: Jan. 19, 2023

(65) Prior Publication Data

US 2024/0059185 A1 Feb. 22, 2024

(30) Foreign Application Priority Data

Aug. 22, 2022 (KR) ........................ 10-2022-0104815

(51) Int. Cl.

| | |
|---|---|
| ***B60L 58/16*** | (2019.01) |
| ***G01R 31/374*** | (2019.01) |
| ***G01R 31/392*** | (2019.01) |
| ***H01M 10/48*** | (2006.01) |
| *H01M 10/42* | (2006.01) |

(52) U.S. Cl.

CPC ............ *B60L 58/16* (2019.02); *G01R 31/374* (2019.01); *G01R 31/392* (2019.01); *H01M 10/48* (2013.01); *H01M 2010/4271* (2013.01); *H01M 2220/20* (2013.01)

(58) Field of Classification Search

USPC ......................... 320/120, 122, 123, 124, 125

See application file for complete search history.

(56) References Cited

U.S. PATENT DOCUMENTS

| | | | | |
|---|---|---|---|---|
| 2016/0214500 | A1* | 7/2016 | Kim | B60L 58/15 |
| 2022/0206079 | A1* | 6/2022 | Liao | G01R 31/392 |
| 2022/0283229 | A1* | 9/2022 | Uoshima | G01R 31/392 |

FOREIGN PATENT DOCUMENTS

| | | | |
|---|---|---|---|
| DE | 102016101789 B4 * | 6/2023 | H02J 7/90 |
| KR | 10-2014-0084823 | 7/2014 | |

* cited by examiner

*Primary Examiner* — Brian Ngo

(74) *Attorney, Agent, or Firm* — MORGAN, LEWIS & BOCKIUS LLP

(57) ABSTRACT

An electrified vehicle and a method of inspecting the electrified vehicle, includes determining a charge time in each of voltage period corresponding to different charge current values, respectively, and determining a state of health of a battery based on charge times in at least one or more periods of the determined charge times in the periods.

17 Claims, 5 Drawing Sheets

| TABLE A | | | CHARGE TIME (sec) | | | | | |
|---|---|---|---|---|---|---|---|---|
| N | T | Ta | Step 1 | Step 2 | ••• | Step X | $\beta_N$ | SOH |
| n | 25 | 25 | $A_n$ | $B_n$ | ••• | $S_n$ | $A_n+B_n+\cdots$ | α |

ELECTRIFIED VEHICLE AND METHOD OF INSPECTION FOR SAME

CROSS REFERENCE TO RELATED APPLICATION

The present application claims priority to Korean Patent Application No. 10-2022-0104815, filed on Aug. 22, 2022, the entire contents of which is incorporated herein for all purposes by this reference.

BACKGROUND OF THE PRESENT DISCLOSURE

Field of the Present Disclosure

The present disclosure relates to a method of inspecting an electrified vehicle provided with a battery to easily determine a state of health of the battery.

Description of Related Art

Recently, as reduction of carbon dioxide emissions is globally increasingly required, demands for electric vehicles or hybrid vehicles that generate driving power by driving a motor using electrical energy stored in an energy storage device such as a battery are greatly increasing instead of typical internal combustion engine vehicles that generate driving power by burning fossil fuel.

Electric vehicles, which are vehicles that obtain power by driving a motor usually using a battery as a power source, require a battery having high output and large capacity. Accordingly, a battery system including a battery pack in which a plurality of battery cells is connected in series or in parallel is applied to electric vehicles.

As more batteries are used for such vehicles, it is important to estimate a state of charge (SOC) or a state of health (SOH) of a battery to secure convenience and safety in use of the battery. However, the characteristics of batteries may be changed in accordance with the chemical constituent of cells and the manufacturing method, so there is a problem that it is required to perform a battery characteristic test every time. Furthermore, there is another problem that the SOH of a battery may be changed in accordance with the propensity of a driver who drives a vehicle provided with the battery and it is difficult to estimate the current SOH of a battery in the instant case.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a method of inspecting an electrified vehicle provided with a battery to easily determine a state of health (SOH) of the battery based on a battery charge time.

The technical subjects to implement in the present disclosure are not limited to the technical problems described above and other technical subjects that are not stated herein will be clearly understood by those skilled in the art from the following specifications.

A method of inspecting an electrified vehicle according to an exemplary embodiment of the present disclosure for achieving the objectives includes: determining a charge time in each of voltage period corresponding to different charge current values, respectively; and determining a state of health of a battery based on charge times in at least one or more periods of the determined charge times in the periods.

For example, the different charge current values may be maintained in the plurality of voltage periods corresponding thereto, respectively.

For example, the determining of charge times may include: checking whether a current charge environment of the determined charge times in the periods and a charge environment of charge times in periods determined in previous charge are a same; and updating the charge times in periods determined in the previous charge into the determined charge times in the periods when the battery controller concludes that the current charge environment and the charge environment are the same.

For example, a current charge environment may include a temperature of the battery and an external air temperature before charge of the battery is performed.

For example, the updating may include: checking and comparing a number of periods of the determined charge times in the periods with a number of reference periods when the current charge environment and the charge environment are the same; checking whether a number of charge times is equal to or greater than a reference number of times when the number of periods of the determined charge times in the periods is greater than the number of reference periods; and updating the charge times in periods determined in the previous charge into the determined charge times in the periods when the number of charge times is equal to or greater than the reference number of times.

For example, the updating may further include updating the determined charge times in the periods for at least one or more periods corresponding to the periods of the determined charge times in the periods of the charge times in periods determined in the previous charge.

For example, the determining of the state of health may include: determining an average charge time in at least one or more periods of the determined charge times in the periods; and removing an abnormal point of the average charge time.

For example, the removing of the abnormal point may include determining a shift average value of average charge times according to a number of charge times and then removing abnormal points of the average charge times based on errors of the average charge times from the shift average value.

For example, the determining of the state of health may further include determining the state of health of the battery based on the shift average value of the average charge times with the abnormal points removed.

An electrified vehicle according to an exemplary embodiment of the present disclosure to achieve the objectives include: a battery; and a battery controller configured to determine a charge time in each of voltage period corresponding to different charge current values, respectively, and configured to determine a state of health (SOH) of the battery based on charge times in at least one or more periods of the determined charge times in the periods.

For example, the battery controller may check whether a current charge environment of the determined charge times in the periods and a charge environment of charge times in periods determined in previous charge are the same when determining the charge times, and may update the charge times in periods determined in the previous charge into the determined charge times in the periods when the battery controller concludes that the current charge environment and the charge environment are the same.

For example, the battery controller may check and compare a number of periods of the determined charge times in the periods with a number of reference periods when the current charge environment and the charge environment are the same, may check whether a number of charge times is equal to or greater than a reference number of times when the number of periods of the determined charge times in the periods is greater than the number of reference periods, and may update the charge times in periods determined in the previous charge into the determined charge times in the periods when the number of charge times is equal to or greater than the reference number of times.

For example, the battery controller may update the determined charge times in the periods for at least one or more periods corresponding to the periods of the determined charge times in the periods of the charge times in periods determined in the previous charge.

For example, the battery controller may be configured to determine an average charge time in at least one or more periods of the determined charge times in the periods, and may determine the state of health of the battery by removing an abnormal point of the average charge time.

For example, the battery controller may be configured to determine a shift average value of average charge times according to the number of charge times and then may remove abnormal points of the average charge times based on errors of the average charge times from the shift average value.

For example, the battery controller may be configured to determine the state of health of the battery based on the shift average value of the average charge times with the abnormal points removed.

According to the electrified vehicle and the method of inspecting the electrified vehicle of the present disclosure, by determining a charge time in each of voltage period corresponding to different charge current values, respectively, and determining a state of health of a battery based on the determined charge times in the periods, it is possible to more easily determine the state of health of a battery than when performing a complicated control logic for variation of the characteristics of a battery due to cell constituent of the battery, etc.

The effects of the present disclosure are not limited to the effects described above and other effects may be clearly understood by those skilled in the art from the following description.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

Figure 1:
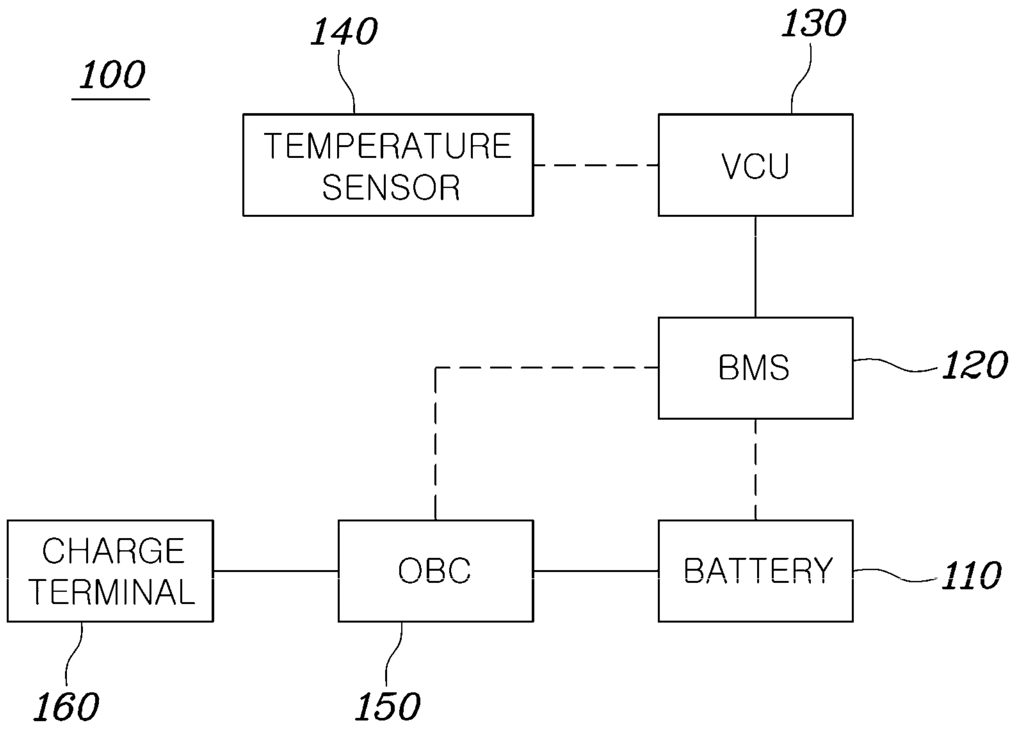
FIG. 1 is a block diagram of an electrified vehicle according to an exemplary embodiment of the present disclosure.

It may be understood that the appended drawings are not necessarily to scale, presenting a somewhat simplified representation of various features illustrative of the basic principles of the present disclosure. The predetermined design features of the present disclosure as included herein, including, for example, specific dimensions, orientations, locations, and shapes will be determined in part by the particularly intended application and use environment.

In the figures, reference numbers refer to the same or equivalent portions of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

In the following description, if it is decided that the detailed description of known technologies related to the present disclosure makes the subject matter of the exemplary embodiments described herein unclear, the detailed description is omitted. Furthermore, the accompanying drawings are provided only for easy understanding of embodiments included in the specification, the technical spirit included in the specification is not limited by the accompanying drawings, and all changes, equivalents, and replacements should be understood as being included in the spirit and scope of the present disclosure.

Terms including ordinal numbers such as “first”, “second”, etc., may be used to describe various components, but the components are not to be construed as being limited to the terms. The terms are used only to distinguish one component from another component.

It is to be understood that when one element is referred to as being “connected to” or “coupled to” another element, it may be directly connected to or directly coupled to another element or be connected to or coupled to another element, having the other element intervening therebetween. On the other hand, it may to be understood that when one element is referred to as being “directly connected to” or “directly coupled to” another element, it may be connected to or coupled to another element without the other element intervening therebetween.

Singular forms are intended to include plural forms unless the context clearly indicates otherwise.

It will be further understood that the terms "comprises" or "have" used in the present specification, specify the presence of stated features, steps, operations, components, parts, or a combination thereof, but do not preclude the presence or addition of one or more other features, numerals, steps, operations, components, parts, or a combination thereof.

Hereafter, various embodiments of the present disclosure will be described in detail with reference to the accompanying drawings and the same or similar components are provided the same reference numerals regardless of the numbers of figures and are not repeatedly described.

A unit or a control unit that included in names such as and a hybrid control unit (HCU) and a vehicle control unit (VCU) is only a term which is generally used to name a controller that controls specific functions of a vehicle rather than meaning a generic function unit. For example, each control unit may include a communication device that communicates with another control unit or a sensor to control corresponding functions, a memory that stores an operating system or logic commands and input/output information, and one or more processors that performs determination, calculation, decision, etc. for controlling the corresponding functions.

First, the configuration of an electrified vehicle 100 according to an exemplary embodiment of the present disclosure is described with reference to FIG. 1.

FIG. 1 is a block diagram of an electrified vehicle 100 according to an exemplary embodiment of the present disclosure.

Referring to FIG. 1, an electrified vehicle 100 according to various exemplary embodiments of the present disclosure may include a battery 110, a battery management system (BMS) 120, a vehicle control unit (VCU) 130, a temperature sensor 140, an on-board charger (OBC) 150, and a charge terminal 160. FIG. 1 mainly shows components related to the present exemplary embodiment, and of course, actually less or more components may be included to implement the electrified vehicle 100. The lines connecting the components but not specifically described in FIG. 1 are power cables, and communication lines for a predetermined automotive controller area network (CAN) are not shown in the figure. However, power electric (PE) elements or control units may be configured to be able to communicate with each other, respectively, through power lines.

Hereafter, components of the electrified vehicle 100 are described.

The battery management system (BMS) 120 can manage the voltage, the current, the temperature, the state of charge (SOC), the state of health (SOC), etc. of the battery 110 and can control charge and discharge of the battery 110. The battery management system 120 can control the intensity of a current which is provided to charge the battery 110 in accordance with the SOC or the voltage state of the battery 110. The battery management system 120 can set and manage an upper limit and a lower limit of the SOC value of the battery 110 and can keep cell type information, rated capacity information, etc. of the battery 110. The battery management system 120 can provide information related to the battery 110 to the outside and can receive instructions about charge and discharge of the battery 110 through a predetermined automotive communication protocol (e.g., a controller area network (CAN)). The battery management system 120 according to an exemplary embodiment of the present disclosure may include a communication device that communicates with another controller or a sensor to control corresponding functions, a memory that stores an operating system or logic commands and input/output information, and one or more processors that performs determination, calculation, decision, etc. for controlling the corresponding functions.

The vehicle control unit (VCU) 130 can transmit a charge or discharge instruction for the battery 110 to the battery management system 120, depending on the state of the battery 110. The vehicle control unit 130 can manage energy of the battery 110 based on state information or total available energy information of the battery 110 that are received from the battery management system 120. Control that considers the cell type and the cell characteristic of the battery 110 may be required to manage the energy of the battery 110. The vehicle control unit 130 can provide data of the temperature of the air outside the vehicle which is measured by the temperature sensor 140 to the battery management system 120.

When AC power is input through the charge terminal 160, the on-board charger (OBC) 140 can convert the input AC power into DC power so that the converted DC power is transmitted to the battery 110. The on-board charger 140 is connected to the battery management system 120 through a CAN communication line, so when the battery management system 120 transmit information of the intensity of a current for charging, the on-board charger 140 can adjust the intensity of DC power in accordance with the information so that the DC power may be transmitted to the battery 110.

Although not shown in FIG. 1, the on-board charger 140 may be configured to be controlled by a vehicle charge management system (VCMS). For example, in the configuration shown in FIG. 1, the on-board charger 140 is used for standard charge that utilizes an AC system power source, but an external charger (EVSE) changes supply voltage and current in DC rapid charge, so a charge current may be controlled in rapid charge in the way that the vehicle charge management system transmits a charge current instruction requested by the battery management system 120 to an external charger.

Figure 2:
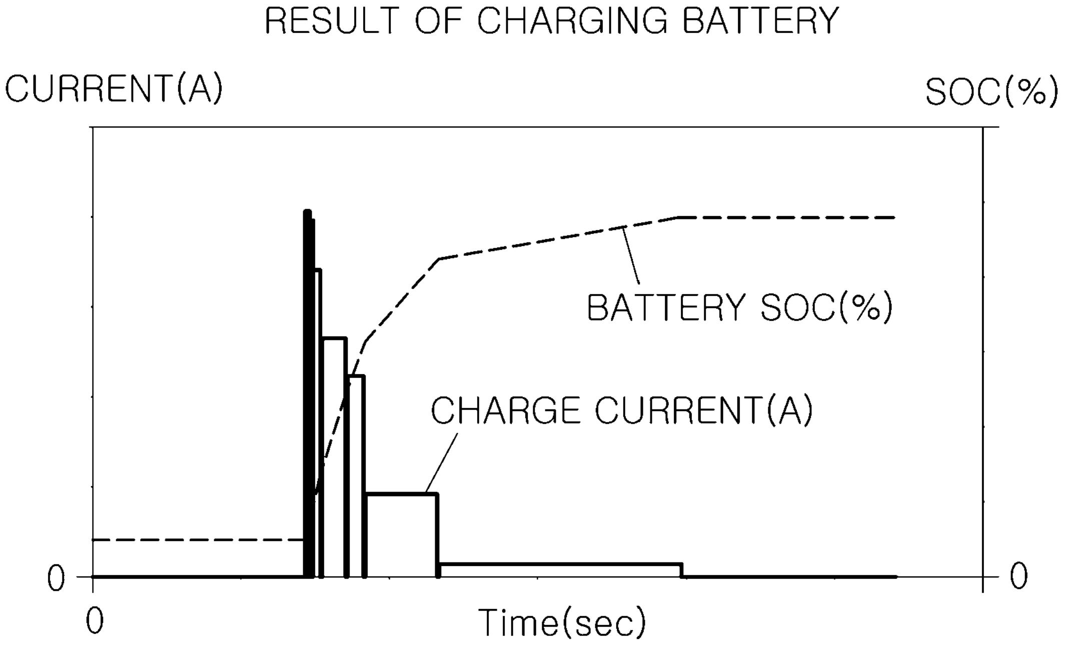
FIG. 2 is a graph showing variation of a current flowing to a battery and an SOC value of the battery when the battery is charged in accordance with an exemplary embodiment of the present disclosure.

FIG. 2 is a graph showing variation of a current flowing to a battery and an SOC value of the battery when the battery is charged in accordance with an exemplary embodiment of the present disclosure.

In FIG. 2, the horizontal axis is a charge time and the vertical axes are the intensity of a current flowing to the battery 110 and the SOC value of the battery 110, respectively. When charging the battery 110, it is possible to charge the battery while adjusting the intensity of a current in specific periods rather than continuously providing a current of the same intensity. It is possible to divide the period until the battery 110 is fully charged into a plurality of periods and charge the battery 110 based on a measurement voltage or a current SOC value of the battery 110. In the instant case, a current is controlled to be supplied with the same intensity to the battery 110 in each of the divided periods. The battery 110 is charged with a current of a predetermined intensity in each period, so that the measurement voltage or SOC value of the battery 110 is increased. When the measurement voltage or SOC value of the battery 110 reaches a target level over time, the next period is entered and the battery 110 may be charged with a current of intensity lower than the previous period. It is possible to charge the battery 110 until the SOC value of the battery 110 becomes full by performing the present process.

The charge time in each period in which the intensity of a current is constant may be a time until before the next period is entered while charging is performed. Accordingly, it is intended in the present disclosure to measure a charge time in each of the divided period and to determine the SOH of the battery based on the charge times. The configuration of a controller that can determine such an SOH is described with reference to FIG. 3.

Figure 3:
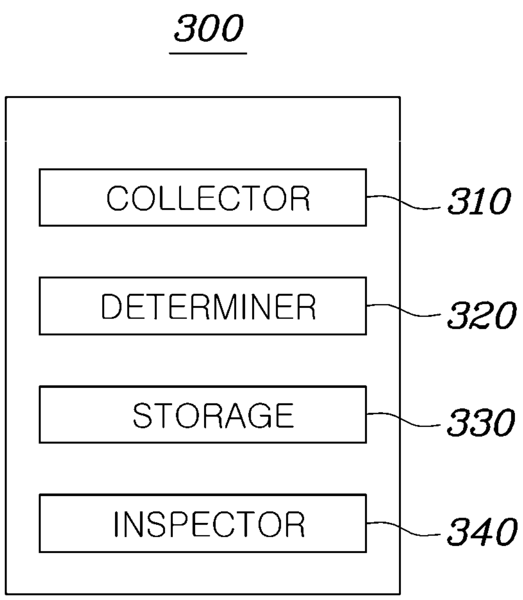
FIG. 3 is a block diagram of a controller performing inspection of an electrified vehicle according to an exemplary embodiment of the present disclosure.

FIG. 3 is a block diagram of a battery controller performing inspection of an electrified vehicle according to an exemplary embodiment of the present disclosure.

Referring to FIG. 3, a battery controller 300 that can determine an SOH in accordance with an exemplary embodiment can determine a charge time in each of voltage periods corresponding to different charge current values, respectively, and can determine the SOH of the battery 110 based on the charge times in at least one or more periods of the determined charge times in the plurality of periods. To the present end, the controller 300 may include a collector 310, a determiner 320, a storage 330, and an inspector 340.

In detail, the collector 310 can collect data required for inspecting the electrified vehicle 100. For example; when charge is performed, the collector 310 can collect data about the charge environment before charge is started. As an exemplary embodiment of the present disclosure, the collector 310 can collect data including the temperature of the battery 110 and external air temperature as charge environment data. This is an example, and of course, various data may exist in relation to a charge environment. Thereafter, smooth control may be performed at the determiner 320 by providing the collected data of temperature of the battery 110 and external air temperature to the determiner 320. When charge is performed, the collector 310 can measure and collect the charge time in each of voltage periods corresponding to different charge current values, respectively.

When charge is performed, the determiner 320 can determine whether the previous charge environment and the current charge environment are the same. It is possible to determine whether the charge environments are the same based on the temperature of the battery 110 and the external air temperature. This is an example, and of course, various methods may be applied to determine whether charge environments are the same. The determiner 320 can compare and determine the number of times of charge and the number of periods of the collected charge times in periods with pre-stored reference data.

The storage 330 can store the charge time in each of voltage periods corresponding to different charge current values, respectively, collected by the collector 310. However, when charge times in periods are randomly stored, there is a problem of a difference and an error when control using the charge times in periods is performed. Accordingly, the storage 330 can store a charge time in each period in accordance with a determination result by the determiner 320. The storage 330 may have a separate data map for storing the charge time in each period.

The inspector 340 can inspect the SOH of the battery 110 based on the charge time in each period stored in the storage 330. For example, the inspector 340 can inspect the SOH of the battery 110 using the charge times in at least one or more periods of the stored charge times in periods. The inspector 340 can perform a process of removing abnormal points to increase accuracy when inspecting the SOH of the battery 110.

When the battery controller 300 is implemented, the battery controller 300 may be implemented as a function of the battery management system (BMS) 120 connected to the battery 110 and may be implemented as a function of an upper control unit that generally is configured to control a powertrain, depending on the type of the vehicle, for example, a vehicle control unit 130 when the vehicle is an electric vehicle and a hybrid control unit (HCU) when the vehicle is a hybrid vehicle. However, this is an example and the present disclosure is not necessarily limited thereto. For example, the battery controller 300 may be implemented as a control unit separately from an upper control unit or may be implemented in a type in which the functions of two or more different control units are separated.

Hereafter, a method of inspecting the electrified vehicle 100 according to an exemplary embodiment of the present disclosure is described with reference to FIG. 4 based on the configuration of the electrified vehicle 100 described with reference to FIG. 1, FIG. 2, and FIG. 3. It is assumed that the battery controller 300 shown in FIG. 3 is implemented as the battery management system (BMS) 120 in FIG. 4 for the convenience of description.

Figure 4:
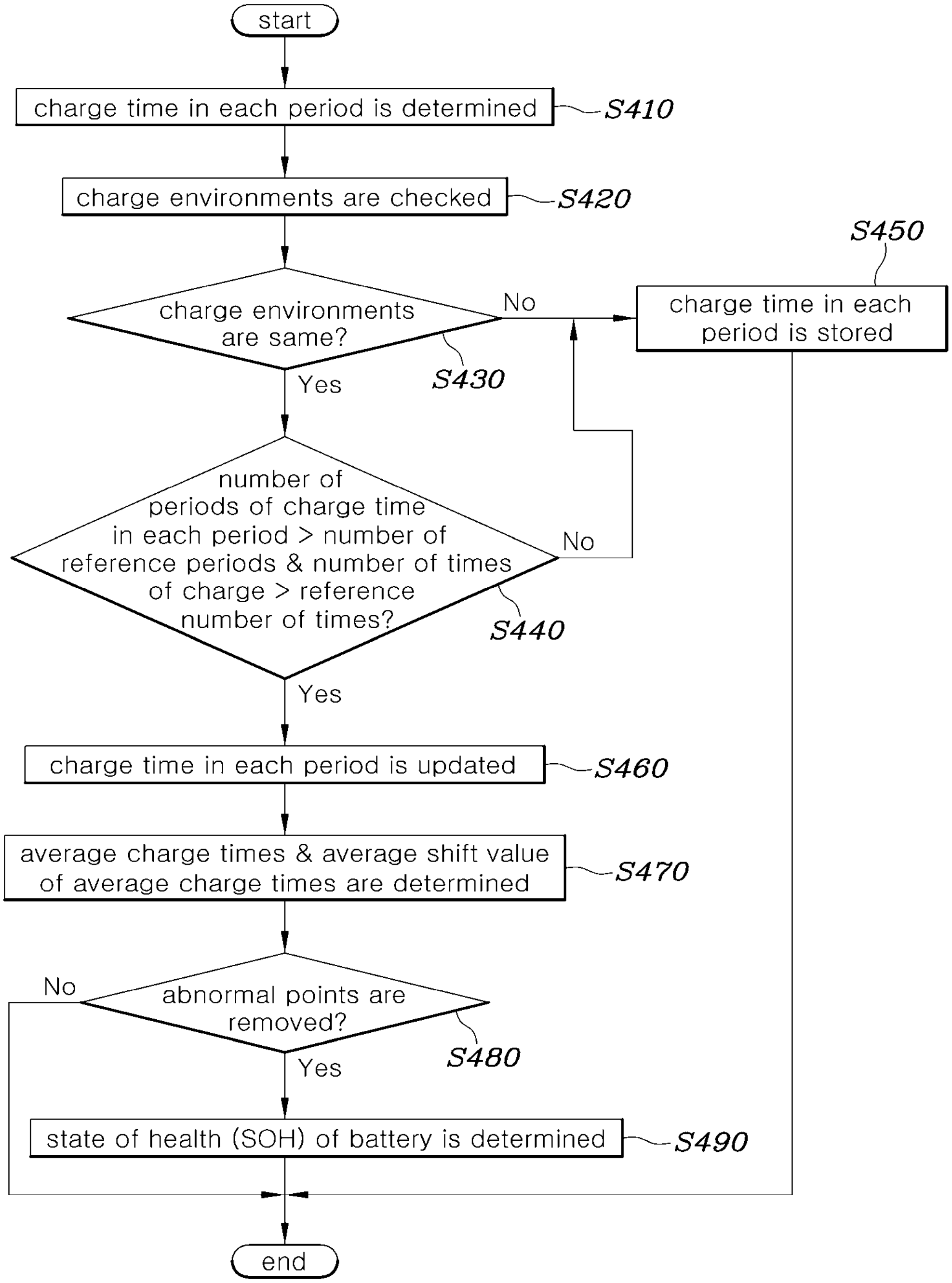
FIG. 4 is a flowchart of a method of inspecting an electrified vehicle according to an exemplary embodiment of the present disclosure.

FIG. 4 is a flowchart of a method of inspecting an electrified vehicle according to an exemplary embodiment of the present disclosure.

First, inspection of the electrified vehicle 100 which is performed hereafter is based on the assumption that the battery 110 has been charged. The battery 110 may be charged in each of voltage periods corresponding to different charge current values, respectively, and the charge current values may be maintained in the corresponding plurality of voltage periods, respectively. Accordingly, as the battery 110 is charged, a charge time in each of the voltage periods corresponding to different charge current values, respectively, may be determined (S410), and in the following description, the battery management system 120 can determine the SOH of the battery based on the determined charge times in the plurality of voltage periods.

In detail, referring to FIG. 4, the battery management system 120 can check a charge environment in charging (S420). The charge environment may include the temperature of the battery 110 and external air temperature before charge is performed. The battery management system 120 can determine whether the charge environment in the current charge and the charge environment in the previous charge are the same (S430). In the present disclosure, it is possible to determine whether the current charge environment and the previous charge environment are the same using temperature of the battery 110 and external air temperature. However, this is an example, and of course, the charge environment data that are used to determine whether charge environments are the same may be data other than the temperature of the battery 110 and external air temperature.

When the current charge environment and the previous charge environment are the same, the battery management system 120 can check the number of periods of previously determined charge times in a plurality of voltage periods, can compare the number with the number of pre-stored reference periods, and can determine whether the currently accumulated number of times of charge has exceeded a pre-stored reference number of times (S440). When the current charge environment and the previous charge environment are not the same (No in S430) or the determined number of periods of charge times in a plurality of voltage periods is less than the number of reference periods and the accumulated number of times of charge is smaller than the reference number of times (No in S440), the battery management system 120 can store the previously determined charge times in a plurality of voltage periods in a separately provided data map (S450).

Figures 5, 6:
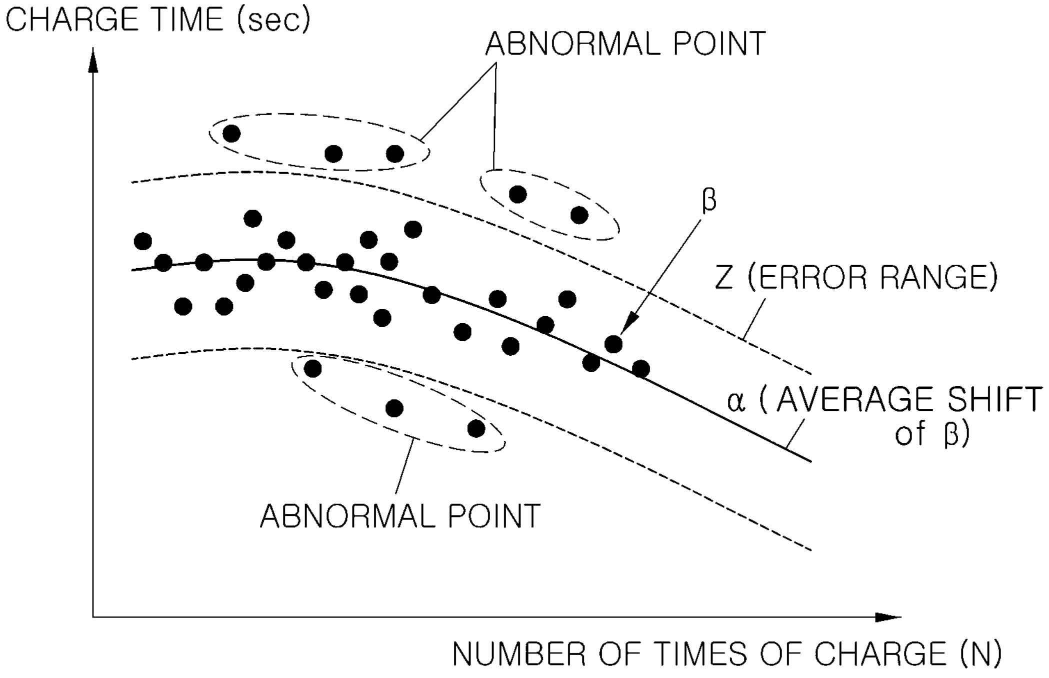
FIG. 5 is an example of a data map in which charge times in a plurality of voltage periods are stored in accordance with an exemplary embodiment of the present disclosure.
FIG. 6 is a graph showing average charge times corresponding to the number of times of charge in accordance with an exemplary embodiment of the present disclosure.

FIG. 5 is an example of a data map in which charge times in a plurality of voltage ranges are stored in accordance with an exemplary embodiment of the present disclosure. In FIG. 5, Step 1, Step 2, . . . , and Step X may be a plurality of first to X-th voltage periods until the SOC value of the battery 110 becomes 100% full from 0%, respectively, and An, Bn, . . . , and Sn may by the charge times consumed in the steps, respectively. N may be the accumulated number of times of charge, T may be the temperature of the battery 110, and Ta may be external air temperature. Accordingly, the battery management system 120 may store previously determined charge times in a plurality of voltage periods in the type of the data map shown in FIG. 5. FIG. 5 may be a data map in which charge times in a plurality of voltage periods are stored when the temperature of the battery 110 and external air temperature are each 25° C. This is an example, and of course, there may be various types of data maps that store charge times in a plurality of voltage periods.

Referring to FIG. 4 again, when the determined number of periods of charge times in a plurality of voltage periods is more than the number of reference periods and the accumulated number of times of charge has exceeded the reference number of times (Yes in S440), the battery management system 120 can update the determined charge times of the periods (S460). In the instant case, the battery management system 120 can update the charge times determined for at least one or more periods corresponding to the currently determined charge times in periods of the charge times in periods determined in previous charge.

Thereafter, the battery management system 120 can determine the SOH of the battery based on the updated charge times in periods.

In detail, the battery management system 120 can determine an average charge time for one or more periods of the charge times in periods and can determine a shift average value of the average charge time according to the accumulated number of times of charge (S470). Referring to FIG. 5, the battery management system 120 can determine an average charge time based on the previously updated charge times in periods. For example, when the accumulated number of times of charge is n, it is possible to determine the average charge time βn through the following Equation 1 by dividing the sum of An, Bn, . . . , and Sn, which are the charge times in periods, by the number of reference periods described above.

$$\beta_n = \frac{A_n + B_n + \ldots + S_n}{X} \quad \text{[Equation 1]}$$

A graph of an average charge time β determined as the accumulated number of times of charge may be expressed as in FIG. 6. FIG. 6 is a graph showing an average charge time corresponding to the number of times of charge in accordance with an exemplary embodiment of the present disclosure. The dots in FIG. 6 are average charge times corresponding to the number of times of charge. The battery management system 120 can determine a shift average value of average charge times according to the accumulated number of times of charge using the average charge times. The shift average value of average charge times may be expressed as a and may be determined through the following Equation 2.

$$\alpha = \sum_{N-Y}^{N} \frac{\beta_{N\_Y} + \beta_{N\_Y+1+\ldots+}\beta_N}{Y} \quad \text{[Equation 2]}$$

Referring to Equation 2, N is the accumulated number of times of charge and Y is a value corresponding to the reference number of times of the number of times of charge, so α may be a shift average value of average charge times corresponding to a total of Y from N−Y to N.

The battery management system 120 can check whether abnormal points of average charge times have been removed based on the determined average charge times and the shift average value of the average charge times (S480). The battery management system 120 can check whether abnormal points have been removed based on whether the average charge times have exceeded a predetermined error range for the shift average value of the average charge times. Referring to FIG. 6, α which is the shift average value of average charge times may be considered as a value showing the tendency of average charge time data. The α is a main datum which is an element for determining the SOH of the battery 110 and it may be required to increase accuracy of a to increase accuracy when determining the SOH of the battery 110. Accordingly, the battery management system 120 can define Z which is an error range of a and can perform an abnormal point removal process of removing β data (that is, the abnormal points shown in FIG. 6) that are out of Z. By performing such an abnormal point removal process, the battery management system 120 can check whether abnormal points of average charge times have been removed. That is, through the abnormal point removal process, the battery management system 120 can reduce an error which may be generated when determining average charge times of charge times in periods and can increase accuracy when determining the SOH of the battery 110 later.

When abnormal points have been removed (Yes in S480), the battery management system 120 can determine the SOH of the battery 110 based on the shift average values of the average charge times with abnormal points removed (S490). Furthermore, the battery management system 120 can store the determined SOH of the battery 110 to correspond to determined charge times in period in a data map, or can update data when data have been stored in advance. For example, in the data map shown in FIG. 5, it is possible to store or update data corresponding to SOH, which is the state of health of the battery, to the position of a. Storing or updating the determined SOH of the battery 110 later is an example, and of course, the determined SOH of the battery 110 may be used in various ways. For example, the battery management system 120 may adjust the charge and discharge output of the battery 110 based on the determined SOH of the battery 110.

Meanwhile, when abnormal points have not been removed (No in S480), it is impossible to accurately determined the SOH of the battery 110 based on the shift average value of the currently determined average charge times, so that the battery management system 120 may not perform control of determining the SOH of the battery 110.

Although the present disclosure was provided above in relation to specific embodiments shown in the drawings, it is apparent to those skilled in the art that the present disclosure may be changed and modified in various ways without departing from the scope of the present disclosure, which is described in the following claims.

The present disclosure may be achieved as computer-readable codes on a program-recoded medium. A computer-readable medium includes all kinds of recording devices that keep data which may be read by a computer system. For example, the computer-readable medium may be an Hard Disk Drive (HDD), an SSD (Solid State Disk), an SDD (Silicon Disk Drive), a ROM, a RAM, a CD-ROM, a magnetic tape, a floppy disk, and an optical data storage.

Furthermore, the term related to a control device such as "controller", "control apparatus", "control unit", "control device", "control module", or "server", etc refers to a hardware device including a memory and a processor configured to execute one or more steps interpreted as an algorithm structure. The memory stores algorithm steps, and the processor executes the algorithm steps to perform one or more processes of a method in accordance with various exemplary embodiments of the present disclosure. The control device according to exemplary embodiments of the present disclosure may be implemented through a nonvolatile memory configured to store algorithms for controlling operation of various components of a vehicle or data about software commands for executing the algorithms, and a processor configured to perform operation to be described above using the data stored in the memory. The memory and the processor may be individual chips. Alternatively, the memory and the processor may be integrated in a single chip. The processor may be implemented as one or more processors. The processor may include various logic circuits and operation circuits, may process data according to a program provided from the memory, and may generate a control signal according to the processing result.

The control device may be at least one microprocessor operated by a predetermined program which may include a series of commands for carrying out the method included in the aforementioned various exemplary embodiments of the present disclosure.

The aforementioned invention can also be embodied as computer readable codes on a computer readable recording medium. The computer readable recording medium is any data storage device that can store data which may be thereafter read by a computer system and store and execute program instructions which may be thereafter read by a computer system. Examples of the computer readable recording medium include Hard Disk Drive (HDD), solid state disk (SSD), silicon disk drive (SDD), read-only memory (ROM), random-access memory (RAM), CD-ROMs, magnetic tapes, floppy discs, optical data storage devices, etc and implementation as carrier waves (e.g., transmission over the Internet). Examples of the program instruction include machine language code such as those generated by a compiler, as well as high-level language code which may be executed by a computer using an interpreter or the like.

In various exemplary embodiments of the present disclosure, each operation described above may be performed by a control device, and the control device may be configured by a plurality of control devices, or an integrated single control device.

In various exemplary embodiments of the present disclosure, the scope of the present disclosure includes software or machine-executable commands (e.g., an operating system, an application, firmware, a program, etc.) for facilitating operations according to the methods of various embodiments to be executed on an apparatus or a computer, a non-transitory computer-readable medium including such software or commands stored thereon and executable on the apparatus or the computer.

In various exemplary embodiments of the present disclosure, the control device may be implemented in a form of hardware or software, or may be implemented in a combination of hardware and software.

Furthermore, the terms such as "unit", "module", etc. included in the specification mean units for processing at least one function or operation, which may be implemented by hardware, software, or a combination thereof.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A method of inspecting an electrified vehicle, the method comprising:

determining, by a battery controller, a charge time of a battery in the electrified vehicle in each of voltage period corresponding to different charge current values, respectively; and determining, by the battery controller, a state of health (SOH) of the battery based on charge times in one or more periods of the determined charge times in the periods, wherein the determining of the state of health includes:

determining an average charge time in at least one or more periods of the determined charge times in the periods; and removing an abnormal point of the average charge time.

2. The method of claim 1, wherein the different charge current values are maintained in the plurality of voltage periods corresponding thereto, respectively.

3. The method of claim 1, wherein the determining of charge times includes:

checking whether a current charge environment of the determined charge times in the periods and a charge environment of charge times in periods determined in previous charge are a same; and updating the charge times in periods determined in the previous charge into the determined charge times in the periods when the battery controller concludes that the current charge environment and the charge environment are the same.

4. The method of claim 3, wherein the current charge environment includes a temperature of the battery and an external air temperature before charge of the battery is performed.

5. The method of claim 3, wherein the updating includes:

checking and comparing a number of periods of the determined charge times in the periods with a number of reference periods when the current charge environment and the charge environment are the same;

checking whether a number of charge times in the voltage periods is equal to or greater than a reference number of times when the number of periods of the determined charge times in the periods is greater than the number of reference periods; and updating the charge times in periods determined in the previous charge into the determined charge times in the periods when the number of charge times is equal to or greater than the reference number of times.

6. The method of claim 5, wherein when the current charge environment and the previous charge environment are not the same or when the current charge environment and the previous charge environment are the same and the determined number of periods of charge times in the voltage periods is less than the number of reference periods and an accumulated number of charge times is smaller than the reference number of times, the battery controller is configured to store the previously determined charge times in the voltage periods in a separately provided data map.

7. The method of claim 3, wherein the updating further includes updating the determined charge times in the periods for at least one or more periods corresponding to the periods of the determined charge times in the periods of the charge times in periods determined in the previous charge.

8. The method of claim 1, wherein the removing of the abnormal point includes:

determining a shift average value of average charge times according to a number of charge times and then removing abnormal points of the average charge times based on errors of the average charge times from the shift average value.

9. The method of claim 8, wherein the determining of the state of health further includes determining the state of health of the battery based on the shift average value of the average charge times with the abnormal points removed.

10. A non-transitory computer readable storage medium on which a program for performing the method of claim 1 is recorded.

11. An electrified vehicle comprising:

a battery; and a battery controller configured to determine a charge time of the battery in each of voltage period corresponding to different charge current values, respectively, and configured to determine a state of health (SOH) of the battery based on charge times in at least one or more periods of the determined charge times in the periods, wherein the battery controller is further configured to:

determine an average charge time in at least one or more periods of the determined charge times in the periods; and determine the state of health of the battery by removing an abnormal point of the average charge time.

12. The electrified vehicle of claim 11, wherein the battery controller is further configured to check whether a current charge environment of the determined charge times in the periods and a charge environment of charge times in periods determined in previous charge are a same when determining the charge times, and to update the charge times in periods determined in the previous charge into the determined charge times in the periods when the battery controller concludes that the current charge environment and the charge environment are the same.

13. The electrified vehicle of claim 12, wherein the battery controller is further configured to:

check and compare a number of periods of the determined charge times in the periods with a number of reference periods when the current charge environment and the charge environment are the same;

check whether a number of charge times in the voltage periods is equal to or greater than a reference number of times when the number of periods of the determined charge times in the periods is greater than the number of reference periods; and update the charge times in periods determined in the previous charge into the determined charge times in the periods when the number of charge times is equal to or greater than the reference number of times.

14. The electrified vehicle of claim 13, wherein when the current charge environment and the previous charge environment are not the same or when the current charge environment and the previous charge environment are the same and the determined number of periods of charge times in the voltage periods is less than the number of reference periods and an accumulated number of charge times is smaller than the reference number of times, the battery controller is configured to store the previously determined charge times in the voltage periods in a separately provided data map.

15. The electrified vehicle of claim 12, wherein the battery controller is further configured to update the determined charge times in the periods for at least one or more periods corresponding to the periods of the determined charge times in the periods of the charge times in periods determined in the previous charge.

16. The electrified vehicle of claim 11, wherein the battery controller is further configured to determine a shift average value of average charge times according to a number of charge times and then to remove abnormal points of the average charge times based on errors of the average charge times from the shift average value.

17. The electrified vehicle of claim 16, wherein the battery controller is further configured to determine the state of health of the battery based on the shift average value of the average charge times with the abnormal points removed.

* * * * *